United States Patent [19]
Dhuey et al.

[11] Patent Number: 5,805,030
[45] Date of Patent: Sep. 8, 1998

[54] ENHANCED SIGNAL INTEGRITY BUS HAVING TRANSMISSION LINE SEGMENTS CONNECTED BY RESISTIVE ELEMENTS

[75] Inventors: Michael Dhuey, Cupertino; David C. Buuck, Santa Clara, both of Calif.

[73] Assignee: Apple Computer, Inc., Cupertino, Calif.

[21] Appl. No.: 511,349

[22] Filed: Aug. 4, 1995

[51] Int. Cl.⁶ .................................................. H01P 3/00
[52] U.S. Cl. .............................. 333/1; 333/33; 333/81 A
[58] Field of Search .............................. 333/1, 24 R, 100, 333/124, 125, 22 R, 81 R, 81 A, 246, 33

[56] References Cited

U.S. PATENT DOCUMENTS

| | | | |
|---|---|---|---|
| 2,019,603 | 11/1935 | Green ........................................... | 333/1 |
| 2,035,536 | 3/1936 | Cowan et al. ................................ | 333/1 |
| 2,343,471 | 3/1944 | Nixon ........................................... | 333/1 X |
| 2,943,272 | 6/1960 | Feldman ...................................... | 333/1 |
| 3,134,950 | 5/1964 | Cook ............................................ | 333/1 X |
| 4,813,047 | 3/1989 | Toda ............................................. | 333/24 R X |
| 5,027,088 | 6/1991 | Shimizu et al. ............................. | 333/1 |

*Primary Examiner*—Benny Lee
*Attorney, Agent, or Firm*—Burns, Doane, Swecker & Mathis, L.L.P.

[57] ABSTRACT

An arrangement in which resistors are interposed on a bus line to attenuate reflected spurious pulses. The resistors are positioned on the bus so as not to be between a processor and its cache memory, but so as to be between the combination of the processor and cache memory and components such as a peripheral controller and a memory controller. The resistors reflect a portion of the pulse energy and attenuate the pulse energy passing through them. In another aspect of the invention, the traces making up the bus are arranged so that the intertrace distance is greater than a distance between the traces and an internal reference plane. This causes magnetic energy radiated by an aggressor trace to encounter the reference plane before it encounters a victim trace. This also reduces the amount of magnetic cross-coupling.

11 Claims, 4 Drawing Sheets

ENHANCED SIGNAL INTEGRITY BUS HAVING TRANSMISSION LINE SEGMENTS CONNECTED BY RESISTIVE ELEMENTS

BACKGROUND

The present invention relates to improving the integrity of signals propagating in a transmission line, and, more particularly, to such improvement as it relates to signals propagating in transmission lines in the form of conductive traces on a printed circuit board (PCB).

High performance computer PCBs incorporate groups of signal traces which are referred to as busses. The busses connect various devices on the board together to create a common signal path between the devices. Such an arrangement is shown in FIG. 1. A processor 10, cache memory 20, PCI controller 30, and memory controller 40 are all connected to a common bus 50 and arranged on a PCB 55. The bus 50 is made up of a group of transmission lines. FIG. 1 shows an eight line bus 50 only for the purposes of simplicity. It will be understood by one of ordinary skill in the art, however, that conventional busses will typically include many more lines such as 32 or 64 lines. The cache memory 20 has high speed output drivers. Busses are routed on the PCB such that the signal traces are physically adjacent.

There are several phenomena which have a negative effect on the integrity of signals on a bus such as bus 50. One such phenomenon is that transition edges in digital signals cause crosstalk to couple magnetically between the traces of the bus. This effect gets worse as the edge rate increases, and edge rates of one volt per nanosecond or more can occur for cache drivers in modern systems. An example of this phenomenon is illustrated in FIG. 2. A signal in a first trace 60 (the aggressor trace) undergoes a transition from a first state to a second state, for example, from a logic high state to a logic low state as shown by waveform A in FIG. 3. This creates a magnetic field (designated by the counterclockwise concentric field lines depicted in FIG. 2) around the first trace 60, the magnitude of which varies as $1/r^2$. Unless measures are taken to prevent it, this magnetic field interacts with an adjacent second trace 70 (the victim trace) where an inverse process occurs (see the clockwise concentric field pattern about trace 70 depicted in FIG. 2), that is, the field causes a pulse to occur on trace 70 despite that the signal on the second trace 70 is quiescent. The coupling is such that a negative edge on the first trace 60 creates a positive pulse on the second trace 70 as shown by signal B in FIG. 3. Similarly, a positive edge on the first trace 60 creates a negative pulse on the second trace 70. The pulse is delayed with respect to the transition(s) which created it. This can corrupt the signal on the second trace 70. Depending on the particular signals being propagated and the arrangement of the traces, energy from two adjacent aggressor traces may couple magnetically into the victim trace. The net effect is that it is possible that the spurious pulse on the trace 70 can reach a level which will be misinterpreted by system logic as an event, i.e., data.

The second problem is that in current designs busses are often unterminated. In other words, the busses lack impedance matching such as parallel resistors at the end points of the bus which would be used for reflection suppression. Busses are left unterminated to avoid large current demands on the output drivers of the devices connected to the bus. Drivers for devices such as application specific integrated circuits (ASICs) are not designed to drive loads such as parallel resistor bus terminations. Since the busses are not terminated, there is an impedance discontinuity at the bus endpoint. This impedance discontinuity reflects an incident pulse travelling down the bus. This can create problems in bus lines in which a signal is undergoing a transition in that the reflected pulses can extend the system settling time. It can also aggravate crosstalk problems in that the reflected signals constitute an additional source of cross-coupled energy.

SUMMARY OF THE INVENTION

The present invention reduces crosstalk and creates local isolation for devices connected on the bus. The invention accomplishes these ends through provision of an apparatus including a bus, the bus having a group of transmission lines. Each of the transmission lines has a first segment having a low resistance, the first segments together forming a first portion of the bus, and the second segments together forming a second portion of the bus. A resistive element electrically connects a first end of the first segment and the first end of the second segment. A first device is connected to the first portion of the bus, and the second device is connected to the second portion of the bus. The first and second segments may be conductive traces on a printed circuit board with resistors connecting the segments. In one preferred embodiment, a processor and cache memory are connected to the first portion of the bus, and other components such as a PCI controller and a memory controller are connected to the second portion of the bus. Also a preferred embodiment, the board includes a conductive reference plane, and the conductive reference plane is arranged so that it is closer to the trace than an intertrace distance.

DETAILED DESCRIPTION OF PREFERRED EMBODIMENTS

Figure 1:
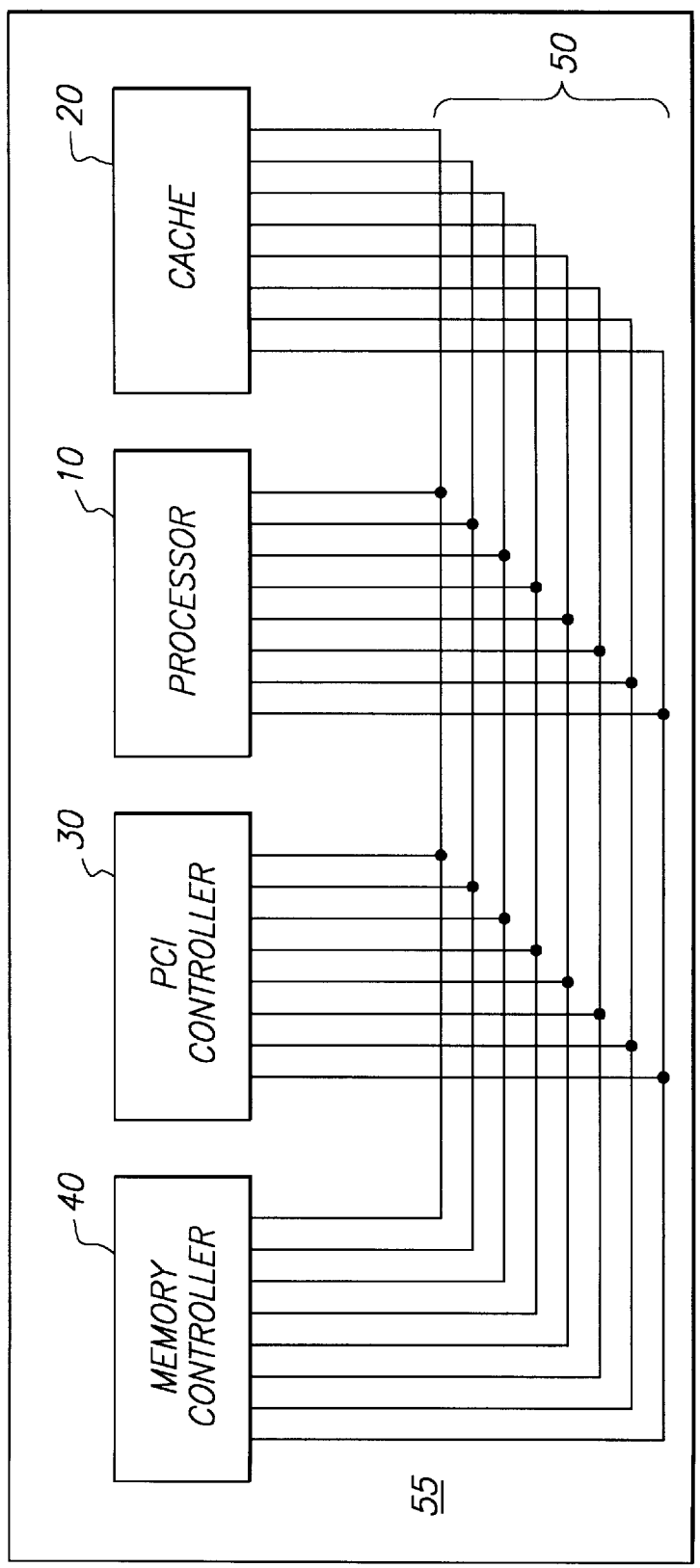
FIG. 1 is a functional block diagram of a conventional computer system.
Figure 2:
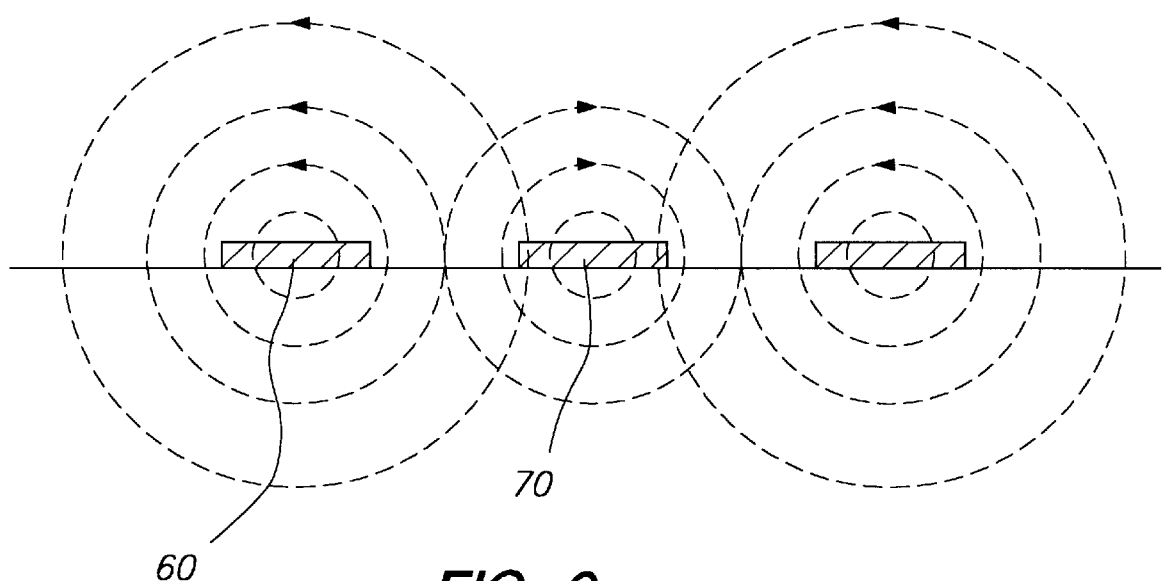
FIG. 2 is a diagram illustrating magnetic cross-coupling of signals between traces.
Figure 3:
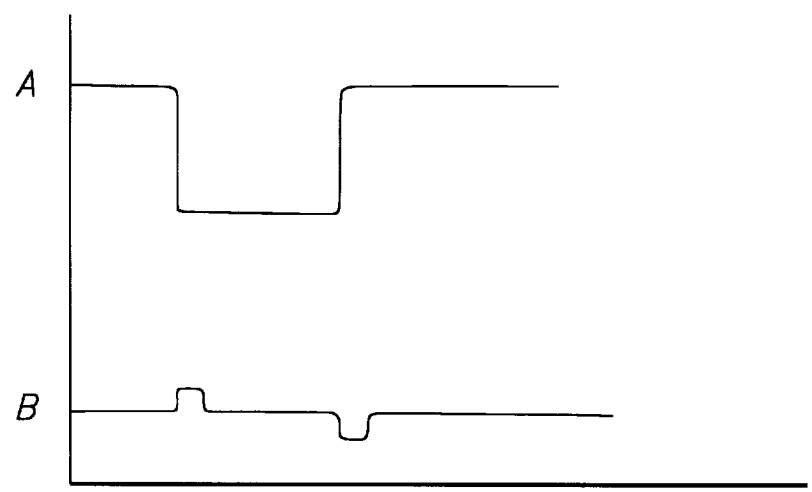
FIG. 3 is a diagram of a signal in one trace and of a resulting induced signal in an adjacent trace.
Figure 4:
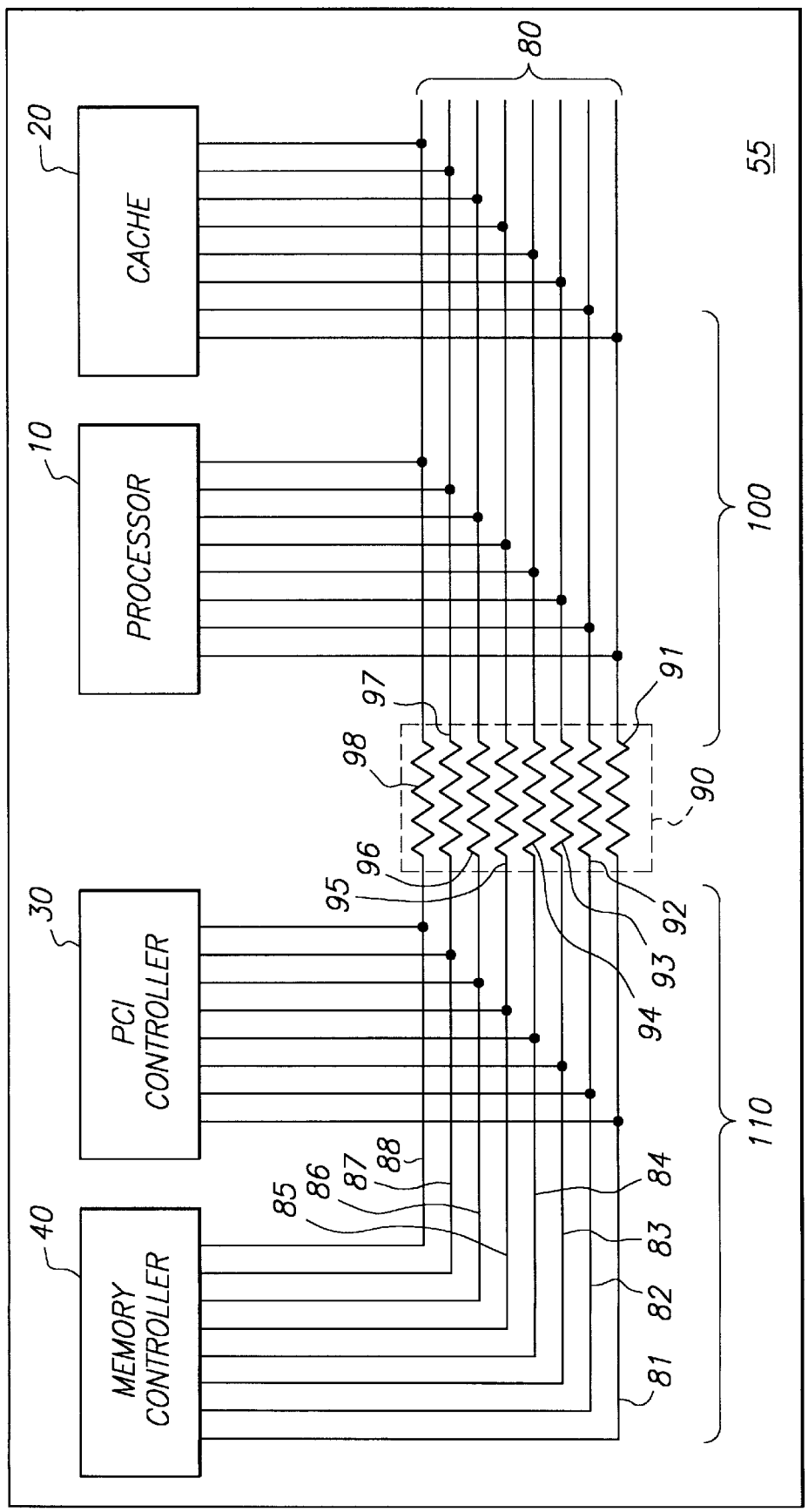
FIG. 4 is a functional block diagram of a computer system incorporating a first preferred embodiment of the present invention.

FIG. 4 shows a system including connecting a processor 10, a cache memory 20, a memory controller 40, and peripheral bus controller 30 arranged on a PCB 55. The system also includes a bus 80 made up of a group of transmission lines 81, 82, 83, 84, 85, 86, 87, and 88 in the form of physically adjacent traces. The bus of FIG. 4 also includes a group 90 of series resistors 91, 92, 93, 94, 95, 96, 97, and 98, one in each of the transmission lines 81, 82, 83, 84, 85, 86, 87, and 88 making up the bus 80. Each of these resistors 91, 92, 93, 94, 95, 96, 97, and 98 respectively divides its corresponding transmission line 81, 82, 83, 84, 85, 86, 87, and 88 into a first segment and a second segment. This creates a bus which is effectively divided into a first portion 100 made up of the first segments and a second portion 110 made up of the second segments. The processor 10 and the cache memory 20 are coupled to the first portion 100 of the bus 80. The other depicted elements are coupled to the second portion 110 of the bus 80.

The theory of operation of an arrangement such as that depicted in FIG. 4 is as follows. The processor 10 and the cache memory 20 are directly coupled on the bus 80, that the presence of the resistors 91, 92, 93, 94, 95, 96, 97, and 98 has no significant effect on data transfer between the processor 10 and the cache memory 20. Also, since no significant amount of current flows on the bus 80, the resistors 91, 92, 93, 94, 95, 96, 97, and 98 have very little effect on data transfers across them. However, spurious crosstalk induced pulses will be attenuated by the resistors 91, 92, 93, 94, 95, 96, 97, and 98. More specifically, it has been determined that crosstalk induced pulses have a greater tendency to arise on the second portion 110 of the bus. When such a pulse is reflected and is travelling back toward the first portion 100 of the bus, it encounters the resistors 90 where its energy is attenuated. The resistors act like a voltage divider, reflecting a substantial portion of the pulse and permitting only part of it through.

The value of the resistors 91, 92, 93, 94, 95, 96, 97, and 98 is typically chosen to match the impedance of the processor bus. The impedance of the processor bus is a function of parameters such as the PC board material, the distance between the traces and the ground plane, and the width of the traces. A typical value would be 50 ohms.

It has been found that the addition of the resistors 91, 92, 93, 94, 95, 96, 97, and 98 on a bus according to the present invention reduces reflections and cross-talk. It also offers the advantages over the introduction of active devices into the bus in that resistors cost less. Also, resistors do not impose propagation delays. For example, the introduction of active devices in place of the resistors 90 would typically add 4 to 5 nanoseconds delay of signal propagation.

It has also been found that if the resistors are chosen to have a value which is the same as that of the impedance of the trace, typically about 50 ohms, then the amplitude of the induced pulses are effectively reduced by half upon every transit through the resistors 90. At the same time, the effect of the resistors 90 on the propagation of pulses in driven traces is not significant. It has been found that transition times are slightly longer, but that the signals settle (achieve steady state value) faster.

Figure 5:
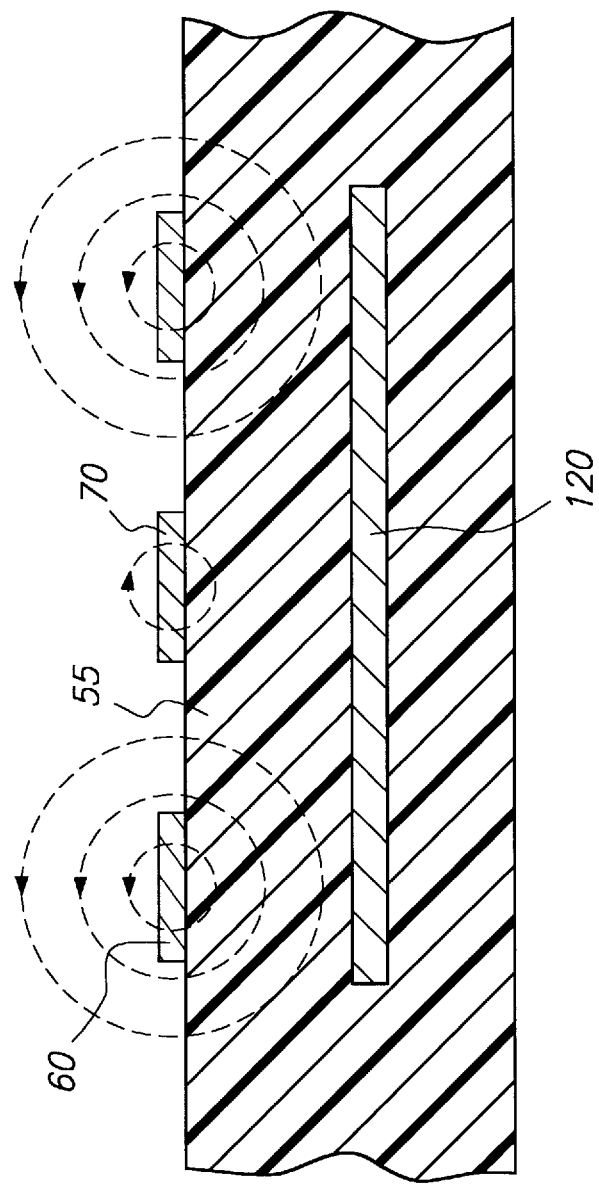
FIG. 5 is a diagram showing relative placement of traces and a conductive reference plane in a presently preferred embodiment of the invention.

As an additional measure to control the amount of magnetically coupled crosstalk between traces, it has also been found to be advantageous to position a conductive reference plane 120 closer to the traces 60, 70 arranged on a PCB 55 than the traces 60, 70 are to each other. This is shown in FIG. 5. To use typical values, the distance between traces can be set to be 0.005 inches with the distance between a given trace 60 or 70 and the conductive reference plane 120 (which may be an internal reference plane as shown) being on the order of 0.004 inches. As before, the dashed-line circles surrounding the traces 60 and 70 indicate magnetic fields, with the arrows indicating a direction of the field and the number of circles serving as a qualitative indication of field strength. Of course, if other design constraints permit spacing wider than 0.005 inches, then it is desirable to do so. Assuming a 0.005 inch trace width and a 0.004 inch displacement from the conductive reference plane, spacing at 0.010 inches produces better suppression, and 0.035 inch spacing produces essentially optimal suppression since even wider spacings do not produce significantly better results.

The conductive reference plane can be one that is at ground potential, or one that is capacitively coupled to ground potential so that it is effectively a ground potential for high frequency signals. It can be an internal plane, or it can be a surface plane. Due to the fact that the distance between the plane 120 and the aggressor trace is less than the distance between the aggressor trace and the victim trace, the magnetic energy from the aggressor trace first encounters and is coupled into the ground plane. This significantly reduces the amount of magnetic energy that is coupled into the victim trace.

The above invention has been described in terms of specific embodiments purely for the purposes of illustrating its principles. It will be readily appreciated by one having ordinary skill in the art that the invention could be embodied differently without departing from these principles. The invention should therefore not be regarded as being limited to these embodiments, but should instead be regarded as fully commensurate in scope with the following claims.

What is claimed is:

1. Apparatus comprising:

a bus including a plurality of transmission lines, each of said transmission lines including, respectively:
   a first segment having a low resistance;
   a second segment having a low resistance;
   a resistive element electrically connecting a first end of said first segment and a first end of said second segment and having a resistance value approximately equal to an impedance value of said transmission line,
   wherein first segments of said transmission lines together define a first portion of said bus and second segments of said transmission lines together define a second portion of said bus;

a first device electrically connected to said first portion of said bus; and a second device electrically connected to said second portion of said bus.

2. Apparatus as claimed in claim 1 wherein each of the resistive elements comprises a respective resistor.

3. Apparatus as claimed in claim 1 further comprising a third device connected to said first portion of said bus.

4. Apparatus as claimed in claim 3 wherein said first device sends a signal on said bus to said third device.

5. Apparatus as claimed in claim 1 wherein a second end of each of the second segments is not terminated.

6. Apparatus as claimed in claim 1 wherein said first device sends a signal on said bus.

7. Apparatus as claimed in claim 1 further comprising a printed circuit board and wherein each of said first and second segments comprises a respective conductive trace on the printed circuit board.

8. Apparatus as claimed in claim 7 wherein said printed circuit board includes a conductive reference plane and wherein a respective lateral distance between adjacent ones of said plurality of transmission lines is greater than a distance between said adjacent ones of said plurality of transmission lines and said conductive reference plane.

9. Apparatus as claimed in claim 8 wherein said conductive reference plane is an internal reference plane.

10. Apparatus comprising:

a bus including a plurality of transmission lines, each of said transmission lines including, respectively:
   a first segment having a low resistance;
   a second segment having a low resistance;
   a resistive element electrically connecting a first end of said first segment and a first end of said second segment, wherein first segments of said transmission lines together define a first portion of said bus and second segments of said transmission lines together define a second portion of said bus;

a first device electrically connected to said first portion of said bus;

a second device electrically connected to said second portion of said bus;

a third device connected to said first portion of said bus;

wherein said first device is a cache memory and sends a signal on said bus to said third device.

11. Apparatus as claimed in claim 10 wherein said third device is a processor.

* * * * *